United States Patent
Matoba et al.

(10) Patent No.: US 6,272,063 B1
(45) Date of Patent: Aug. 7, 2001

(54) SEMICONDUCTOR MEMORY DEVICE

(75) Inventors: Kenichi Matoba; Masaru Koyanagi, both of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/535,952

(22) Filed: Mar. 27, 2000

Related U.S. Application Data

(62) Division of application No. 09/058,218, filed on Apr. 10, 1998, now Pat. No. 6,069,835.

(30) Foreign Application Priority Data

Apr. 11, 1997 (JP) .................................................. 9-094064

(51) Int. Cl.[7] .................................................. G11C 8/00
(52) U.S. Cl. .................. 365/230.03; 365/230.02; 365/230.04; 365/230.01; 365/230.06; 365/230.08
(58) Field of Search .................. 365/230.01, 230.03, 365/230.02, 230.06, 230.08, 189.01

(56) References Cited

U.S. PATENT DOCUMENTS

| | | | |
|---|---|---|---|
| 5,625,599 | * 4/1997 | Okamura | 365/205 |
| 5,732,040 | 3/1998 | Yabe | 365/230.03 |
| 5,740,120 | * 4/1998 | Okamura | 365/230.03 |
| 5,748,201 | 5/1998 | Nagasaka | 345/509 |
| 5,838,603 | * 11/1998 | Mori et al. | 365/63 |
| 5,862,096 | * 1/1999 | Yasuda et al. | 365/229 |
| 5,890,197 | 3/1999 | Nagasaka | 711/105 |
| 6,069,835 | * 5/2000 | Matoba et al. | 365/230.03 |

FOREIGN PATENT DOCUMENTS 410289570A    10/1998    (JP) .

* cited by examiner

Primary Examiner—Viet Q. Nguyen
(74) Attorney, Agent, or Firm—Banner & Witcoff, Ltd.

(57) ABSTRACT

A semiconductor memory device comprises a first core section including a plurality of memory cell arrays, a second core section including a plurality of memory cell arrays and provided below the first core section, a third core section including a plurality of memory cell arrays and provided in a right side of the first core section, and a fourth core section including a plurality of memory cell arrays and provided in a right side of the second core section, wherein at least a part of the memory cell arrays of the first core section and at least a part of the memory cell arrays of the fourth core section are simultaneously activated, and at least a part of the memory cell arrays of the second core section and at least a part of the memory cell arrays of the third core section are simultaneously activated.

11 Claims, 15 Drawing Sheets

SEMICONDUCTOR MEMORY DEVICE

This application is a division of prior application Ser. No. 09/058,218 filed Apr. 10, 1998 now U.S. Pat. No. 6,069,835.

BACKGROUND OF THE INVENTION

The present invention relates to a semiconductor memory device having memory cells, and particularly, to a semiconductor memory device having memory cell arrays divided longitudinally and laterally into four core sections.

To reduce operational currents of a semiconductor memory device, memory cell arrays are dispersively activated. In recent years, to further reduce operational currents, all memory cell arrays are divided into two groups, one of the two groups is selected, and memory cell arrays belonging to the selected group are dispersively activated.

FIG. 1 shows a structure of a conventional semiconductor memory device. In the following, same components are denoted by same reference symbols, and reiteration of those components will be omitted.

Core sections 1 to 4 generally have equal memory capacities. The core sections 1, 2, 3 and 4 are respectively positioned at the upper left, lower left, upper right, and lower right of a chip CP.

An address buffer 11 is provided at an area between the core sections 3 and 4, for example. The address buffer 11 is supplied with external address signals A0 to A11 from a pad in the chip CP and generates control signals RAt11 and RAc11 from, for example, an address signal A11.

Core section buffers 5 to 8 are arranged adjacent to the core sections 1 to 4, respectively. The core section buffers 5 and 6 are supplied with a control signal RAt11 outputted from the address buffer 11, and the core section buffers 7 and 8 are supplied with a control signal RAc11 outputted from the address buffer 11. The core section buffers 5 to 8 respectively activate the core sections 1 to 4 in accordance with the control signals RAt11 and RAc11.

Each of the core sections 1 to 4 comprises a plurality of memory cell arrays 10, sense amplifiers 90 connected to the memory cell arrays 10, and circuits (not shown) for selecting memory cells in accordance with a signal, such as an array decoder and a row decoder. As shown in FIG. 1, the memory cell arrays 10 and sense amplifiers 9 are disposed alternately, and each of the sense amplifiers 9 is shared by two memory cell arrays 10. The array decoder selects one or more memory cell arrays in a core section to be activated by an instruction, in accordance with an upper bit of an address signal supplied through a core section buffer. The row decoder selects a word line of the memory cell array selected by the array decoder, in accordance with a lower bit of an address signal supplied through a core section buffer.

Peripheral circuits 12 such as row decoders and column decoders described above are provided between the core sections 1 and 2, 3 and 4, 1 and 3, as well as 2 and 4.

A plurality of pads 50 are provided at the areas where the peripheral circuits 12 are provided such that the pads are disposed laterally, for example. A part of the pads are used as power supply pads.

The following will be an explanation of a method of activating memory cell arrays divided into four core sections.

An address buffer 11 generates control signals RAt11 and RAc11 relating to rows, from a bit A11 of an external address signal. The control signal RAc11 is an inverted signal of the control signal RAt11. In the following, "c" indicates an inverted signal and "t" indicates a non-inverted signal.

Where the signal RAt11 is of a selected state and the signal RAc11 is of a non-selected state, the upper left core section 1 and the lower left core section 2 are selected. In this state, the upper right core section 3 and the lower right core section 4 are not selected and deactivated.

Further, memory cells of each of the selected core sections 1 and 2 are divided into two groups, and memory cells belonging to one of the groups are activated in accordance with an upper address of the address signal. FIG. 1 shows a semiconductor memory device in this state. In the figure, those memory cell arrays 10 and sense amplifiers 9 which are hatched by oblique lines indicate activated arrays and sense amplifiers.

Where the signal RAt11 is of a non-selected state and the signal RAc11 is of a selected state, the memory cells of the upper right core section 3 and the lower right core section 4 are activated.

When a bit line is charged or discharged by sense amplifiers, e.g., when the potential of a bit line is changed from ½×Vcc to Vcc or Vss, noise is generated by the switching operation of a transistor for connecting a sense amplifier with a bit line.

In a conventional semiconductor memory device, activated cell arrays are concentrated at the left or right half of the semiconductor memory device. When the core sections 1 and 2 are activated, noise is generated concentrically in the left half of the semiconductor memory device. When the core sections 3 and 4 are activated, noise is generated concentrically in the right half of the semiconductor memory device.

The noise thus generated is reflected on power supply lines or the like and influences the operation of input pins and peripheral circuits in the vicinity of the activated core sections. Specifically, the potential of power supply lines supplied with a voltage Vss rises thereby hindering supply of a Vss level. As a result, threshold voltages and the like of elements forming sense amplifiers and peripheral circuits are changed, and associated circuits cause operation errors.

In FIG. 2, it is supposed that a power supply pad 13 supplied with a voltage Vss is provided in the left side of an area between the core sections 1 and 2, and a power supply pad 14 supplied with a voltage Vcc is provided in the right side of an area between the core sections 3 and 4. FIG. 2 shows a case where the core sections 3 and 4 are activated and arrows in this figure indicate main flows of currents to a power supply pad.

Power supply lines from the power supply pad 13 to the core sections 3 and 4 are longer than power supply lines from the power supply pad 13 to the core sections 1 and 2. Therefore, a voltage drop caused in the power supply lines is large when the core sections 3 and 4 are activated. An influence from the voltage drop in the power supply lines when the core sections 3 and 4 are activated is therefore greater than that when the core sections 1 and 2 are activated.

In FIG. 3, it is supposed that a power supply pad pair 15 respectively supplied with voltages Vcc and Vss is provided in the left side of an area between the core sections 1 and 2, and another power supply pad pair 16 respectively supplied with voltages is provided in the right side of an area between the core sections 3 and 4. Arrows in this figure indicate main flows of currents to the power supply pads.

In this case, a length of power supply lines from the left power supply pad pair 15 to the core sections 1 and 2 are substantially the same as that of the power supply lines from the right power supply pad pair 16. Therefore, unlike the example shown in FIG. 2, an influence from a voltage drop does not vary much depending on the positions of activated core sections.

However, when the core sections 1 and 2 are activated, currents concentrically flow through the left power supply pad pair 15. When the core sections 3 and 4 are activated, currents concentrically flow through the right power supply pad pair 16.

Generally, a semiconductor chip is sealed on a lead frame by resin and pads such as power supply pads are connected to inner leads by bonding wires thereto. A packaged semiconductor device is set on a board and outer leads are connected to wires on the board. Therefore, a pad supplied with a voltage Vss is applied with inductance from the lead frame and the wires on the board. Where L is the inductance applied to the power supply pad, noise is expressed as L×di/dt. Therefore, as described above, large noise is generated by the inductance when a current concentrically flows through one pair of power supply pads.

Thus, power supply noise caused by resistance or inductance reaches such a level that significantly influences the operation of circuits.

BRIEF SUMMARY OF THE INVENTION

The present invention has an object of reducing generation of noise in a semiconductor memory device in which memory cell arrays are activated dispersively.

A semiconductor memory device according to the present invention comprises at least four memory cell arrays arranged in matrix, wherein the memory cell arrays are activated to prevent from simultaneously activating memory cell arrays arranged longitudinally.

Specifically, a semiconductor memory device has a following structure.

A semiconductor memory device according to the present invention comprises a first core section including a plurality of memory cell arrays; a second core section including a plurality of memory cell arrays and provided below the first core section; a third core section including a plurality of memory cell arrays and provided in a right side of the first core section; and a fourth core section including a plurality of memory cell arrays and provided in a right side of the second core section, wherein at least a part of the memory cell arrays of the first core section and at least a part of the memory cell arrays of the fourth core section are simultaneously activated, and at least a part of the memory cell arrays of the second core section and at least a part of the memory cell arrays of the third core section are simultaneously activated.

Another semiconductor memory device according to the present invention comprises a first core section including a plurality of memory cell arrays; a second core section including a plurality of memory cell arrays and provided below the first core section; a third core section including a plurality of memory cell arrays and provided in a right side of the first core section; a-fourth core section including a plurality of memory cell arrays and provided in a right side of the second core section; and an address buffer having an input terminal supplied with an address signal, for outputting a first or second activation signal in accordance with a part of the address signal, the first activation signal making the first and fourth core sections be activated and the second activation signal making the second and third core sections be activated.

Preferred embodiments of the present invention are as follows.

(1) A first power supply line connected to the first and third core sections and provided along lower edges of the first and third core sections; a second power supply line connected to the second and fourth core sections and provided along upper edges of the second and fourth core sections and below the first power supply line; and a wire for connecting the first and second power supply lines with each other at an area between the first and second core sections and at an area between the third and fourth core sections are further provided.

(2) In the above (1), a plurality of pads are provided between the first and second power supply lines and the wire is provided at an area between the pads.

(3) Each of the first to fourth core sections includes a core section buffer having an input terminal supplied with another part of the address signal and with the first or second activation signal which activates the core section corresponding to the core section buffer, for outputting the address signal supplied, in accordance with the activation signal supplied, an array decoder for selecting one of the plurality of memory cell arrays forming the core sections, with of use an upper bit of the address signal outputted from the core section buffer, and a row decoder for selecting one of a plurality of word lines of the memory cell array selected by the array decoder, with use of a lower bit of the address signal.

(4) A first output buffer is shared by the first and second core sections and a second output buffer is shared by the third and fourth core sections.

(5) In the above (1), each of the plurality of memory cell arrays has at least two sub-memory cell arrays, and when one of the two sub-memory cell arrays is activated, another sub-memory cell array is deactivated.

(6) In the above (1), each of the plurality of memory cell arrays has at least two sub-memory cell arrays, and each of the sub-memory cell arrays is operated independently.

(7) In the above (1), a sense amplifier for sensing and amplifying data from the plurality of memory cell arrays is shared by adjacent memory cell arrays.

According to the present invention, core sections arranged longitudinally and laterally are activated diagonally, and activated memory cell arrays are dispersed. Therefore, influences from noise can be reduced and are prevented from affecting the operation of circuits.

Also, since activated core sections are dispersed, heat generation during operation is also dispersed. Accordingly, the present invention is particularly advantageous when the heat generation amount is large, e.g., in case of operation at a high frequency.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out hereinbefore.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Embodiments of the present invention will now be explained with reference to the drawings.

Figure 4:
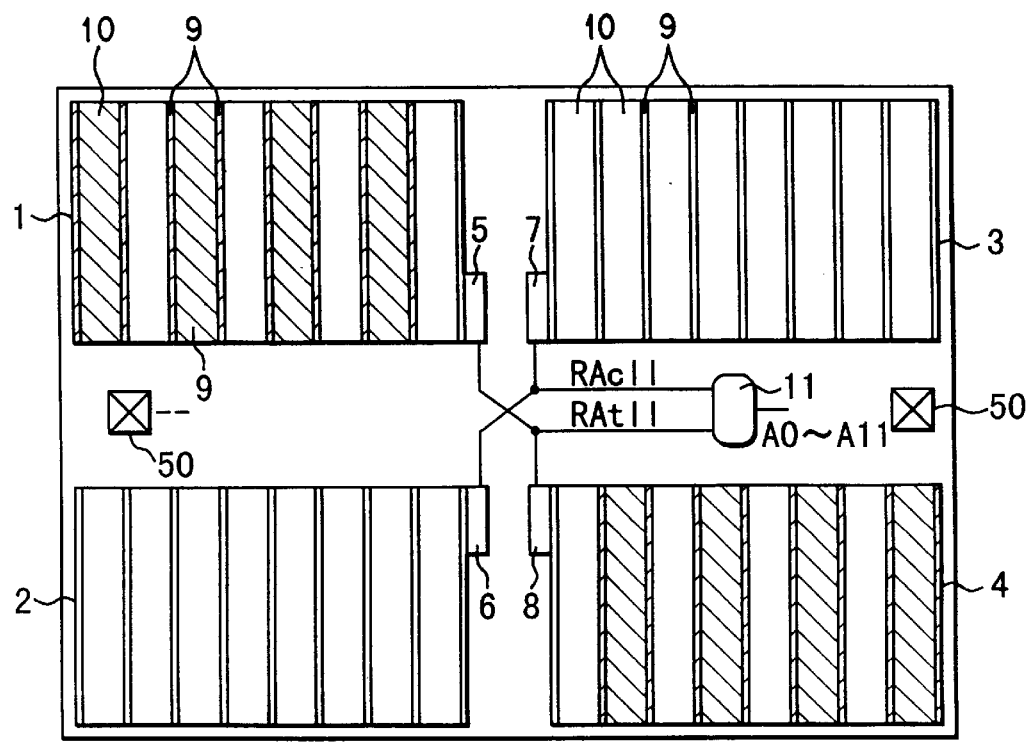
FIG. 4 is a view showing a semiconductor memory device according to the present invention.

FIG. 4 is a view schematically showing a structure of a semiconductor memory device according to an embodiment of the present invention.

Figure 1:
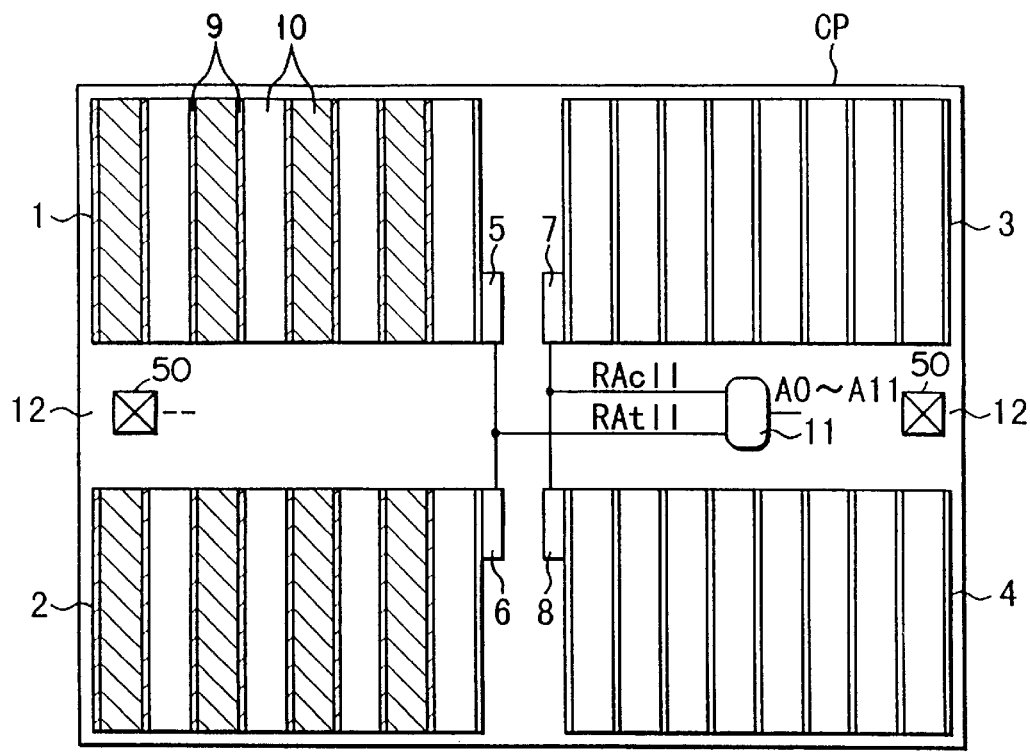
FIG. 1 is a view showing a conventional semiconductor memory device.
Figure 2:
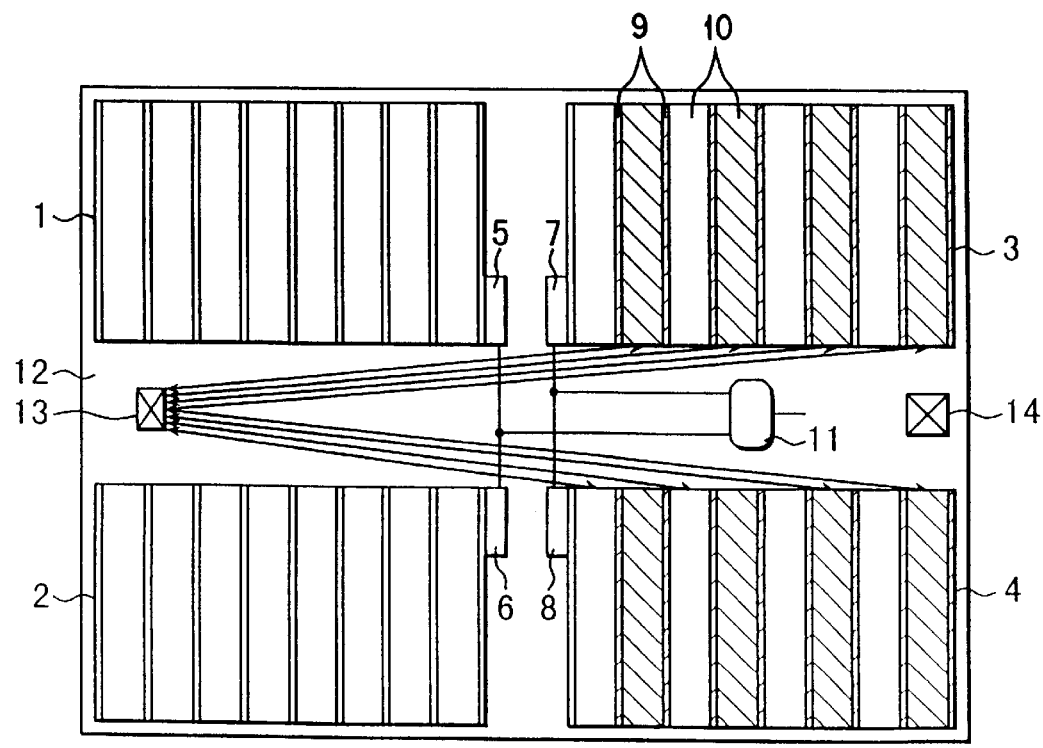
FIG. 2 is a view showing current flows in a conventional semiconductor memory device.
Figure 3:
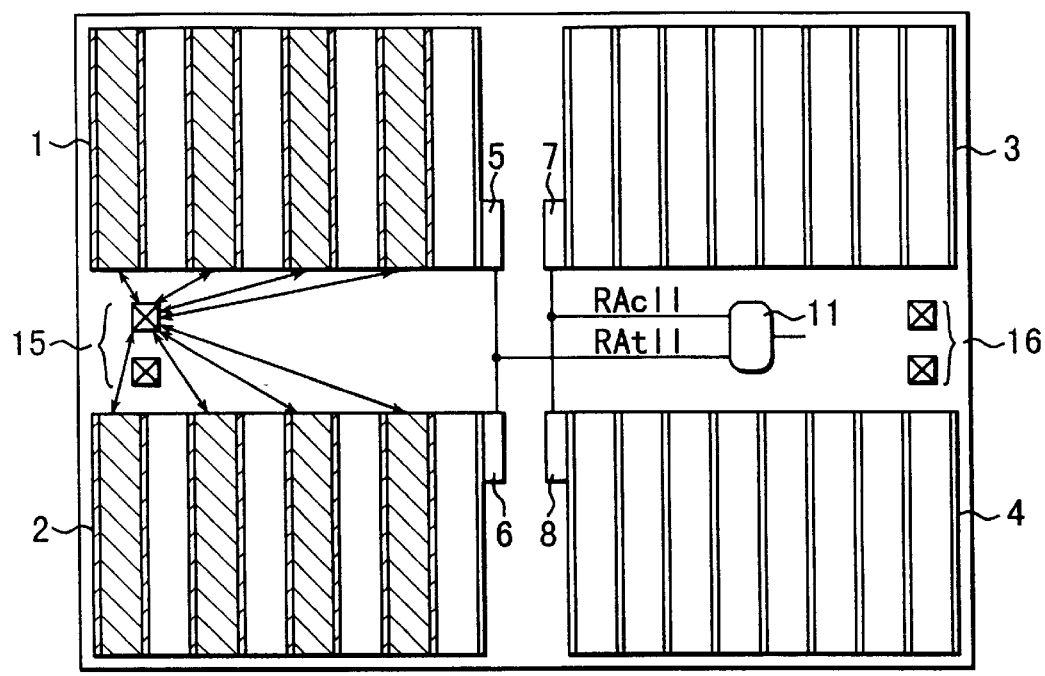
FIG. 3 is a view showing current flows in a conventional semiconductor memory device.

An output signal RAt11 from an address buffer 11 is supplied to a core section buffer 5 connected to an upper left core section 1 and a core section buffer 8 connected to a lower right core section 4. An output signal RAc11 from the address buffer 11 is supplied to a core section buffer 6 connected to a lower left core section 2 and a core section buffer 7 connected to an upper right core section 3. The other components than those described above are the same as those of a prior art example shown in FIG. 1.

In the following, operation of the present embodiment will be described.

External address signals A0 to A11 are supplied to the address buffer 11. The address buffer 11 generates control signals RAt11 and RAc11 relating to rows, from a bit A11 of the external address signals. Each of control signals RAc11 and RAt11 is an inverted signal of the other.

When the signal RAt11 is of a selected state and the signal RAc11 is of a non-selected state, the upper left core section 1 and the lower right core section 4 are selected. In this state, the lower left core section 2 and the upper right core section 3 are not selected but are deactivated. Meanwhile, when the signal RAc11 is of a selected state and the signal RAt11 is of a non-selected state, the lower left core section 2 and the upper right core section 3 are selected, but the upper left core section 1 and lower right core section 4 are not selected. Thus, the core sections are selected diagonally.

Like in the prior art example, memory cells to be activated in selected core sections are dispersed.

In the present embodiment, the memory cell arrays are activated uniformly in the longitudinal and lateral directions, unlike the prior art example. Activation is not concentrated, for example, in the core sections in the left half or upper half of the device as in a conventional semiconductor memory device. Therefore, noise generated when sense amplifiers are operated is dispersed longitudinally and laterally.

Figure 5:
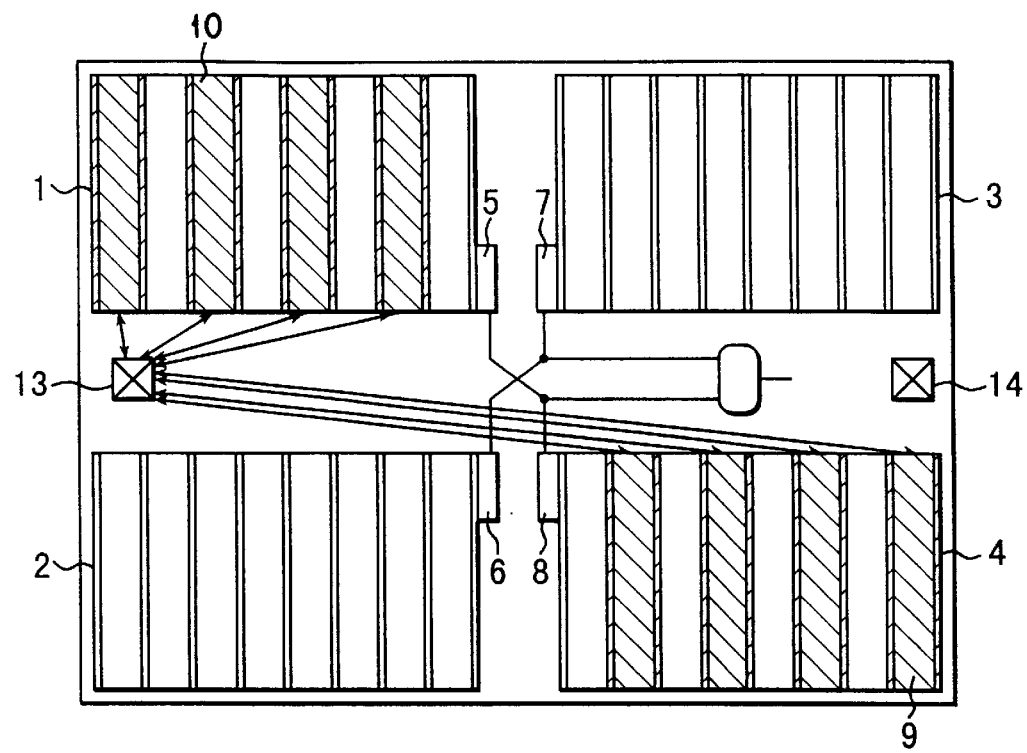
FIG. 5 is a view showing current flows in the embodiment shown in FIG. 4.

FIG. 5 shows current flows when providing a power supply pad supplied with a power supply voltage Vcc. A power supply pad 13 is supplied with a power supply voltage Vcc and a power supply pad 14 is supplied with a voltage Vss. Arrows shown in FIG. 5 indicate main current flows to a power supply pad.

When the core sections are activated, the core section 3 or 4 is far from the power supply pad 13. Therefore, a voltage drop caused by wires in the chip cannot be changed depending on the combination of core sections. The voltage drop has a maximum value smaller than that of a conventional device. Accordingly, it is possible to reduce harmful influences on input pins and peripheral circuits in the vicinity of the activated core sections.

Figure 6:
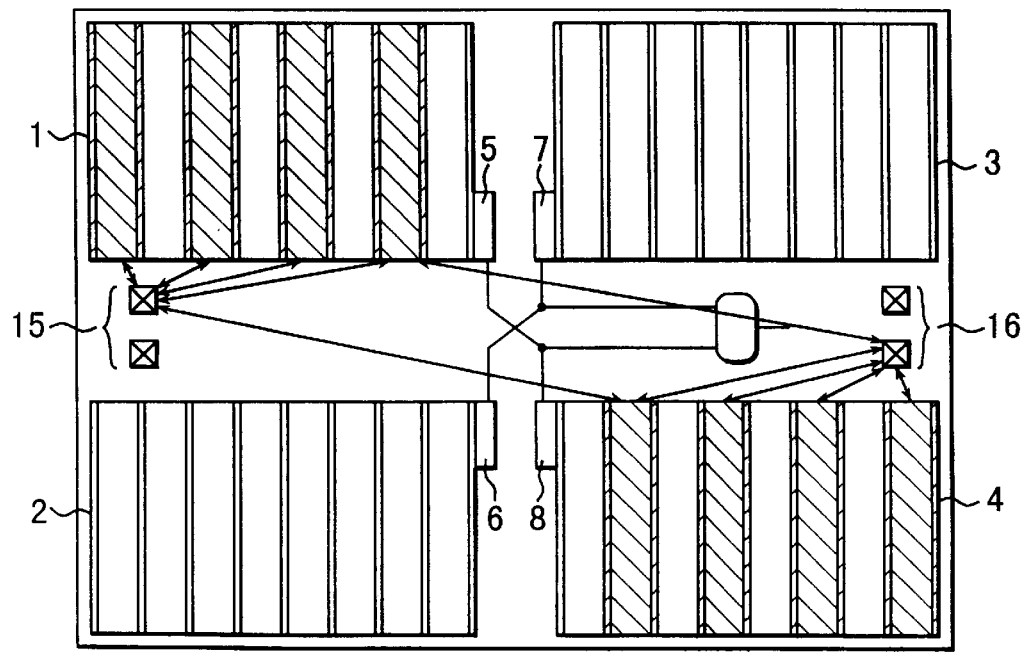
FIG. 6 is a view showing current flows in the embodiment shown in FIG. 4.

FIG. 6 shows current flows when of providing two power supply pads supplied with a power supply voltage Vcc. The power supply pad pair 15 is supplied with power supply voltages Vcc and Vss, and another power supply pad pair 16 is also supplied with power supply voltages Vcc and Vss. In the example shown in FIG. 6, the power supply pad pair 15 is provided in the left side of an area between the core sections 1 and 2, and the power supply pad pair 16 is provided in the right side of an area between the core sections 3 and 4. Arrows in FIG. 6 indicate main flows of currents to the power supply pads.

The amount of currents flowing through the power supply pad pair 15 is substantially equal to the amount of currents flowing through the power supply pad pair 16 in either case where the core sections 1 and 4 are activated or case where the core sections 2 and 3 are activated. Therefore, the maximum value of the currents flowing through the power supply pad pairs 15 and 16 can be reduced more than in a conventional device. As a result, noise generated by inductance applied to the power supply pads can be reduced.

Figure 7:
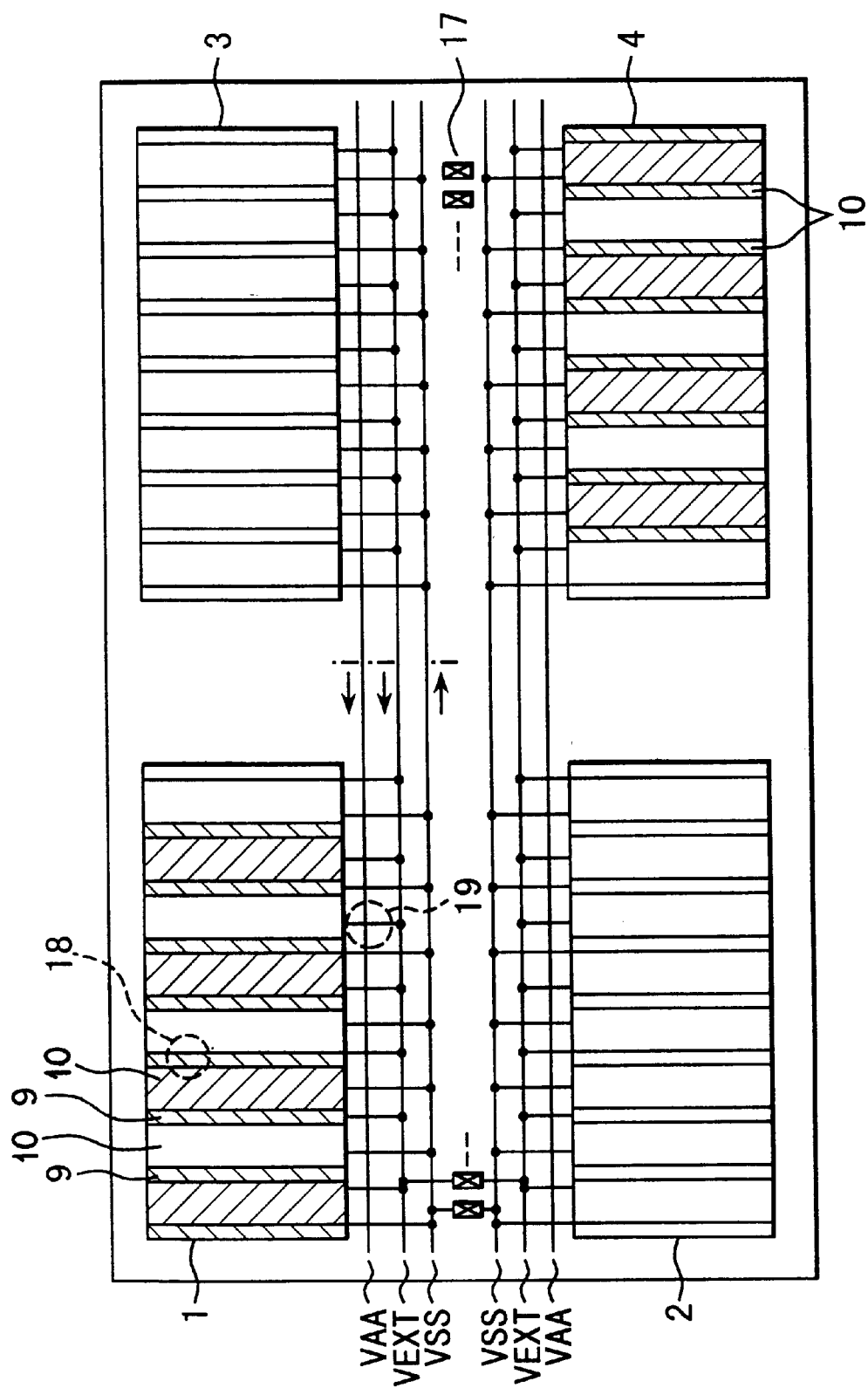
FIG. 7 is a view showing a layout of power supply lines.

FIG. 7 shows a layout of power supply lines in the embodiment shown in FIG. 4. In FIG. 7, a reference 17 denotes pads.

Figure 8:
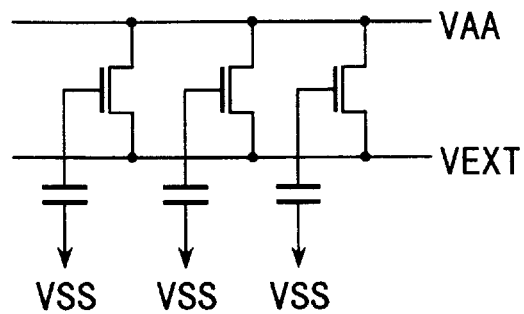
FIG. 8 is a circuit provided between a power supply line VEXT and a power supply line VAA.

Power supply lines VEXT are connected to power supply pads supplied with a power supply voltage Vcc. The power supply lines VEXT are also connected to peripheral circuits, for example. Power supply lines VAA are supplied with a voltage obtained by decreasing a voltage Vcc by a circuit as shown in FIG. 8. The circuit shown in FIG. 8 is provided at the area 19 shown in FIG. 7, for example. The power supply lines VAA serve to supply core sections of sense amplifiers with the decreased voltage and to supply memory cells with a voltage for restoring. The power supply lines VSS are connected to power supply pads supplied with a voltage VSS. The power supply lines VEXT, VAA, and VSS are connected to each of core sections 1 to 4.

The power supply lines VEXT, VAA, and VSS are provided along lower edges of the core sections 1 and 3 and upper edges of the core sections 2 and 4. The power supply line provided along the lower edge of the core section 1 are connected to the power supply lines provided along the lower edge of the core section 3, while the power supply lines provided along the upper edge of the core section 2 are connected to power supply lines provided along the upper edge of the core section 4. Generally, pads are sequentially provided at an area between the upper core sections 1 and 3 and the lower core sections 2 and 4. Therefore, the power supply lines connected to the upper core sections 1 and 3 are connected to the power supply lines connected to the lower core sections 2 and 4, only through the pads.

Suppose that the power supply pads supplied with power supply voltages Vcc and Vss are provided at an area between the core sections 3 and 4, for example, and that i expresses a current outputted from one of activated core sections. When the core sections 1 and 4 are activated, a current i flows through the power supply lines VEXT, VAA, and VSS connected to the core sections 1 and 4, but a substantial current does not flow through the core sections 2 and 3 since the core sections 2 and 3 are not activated.

Figure 9:
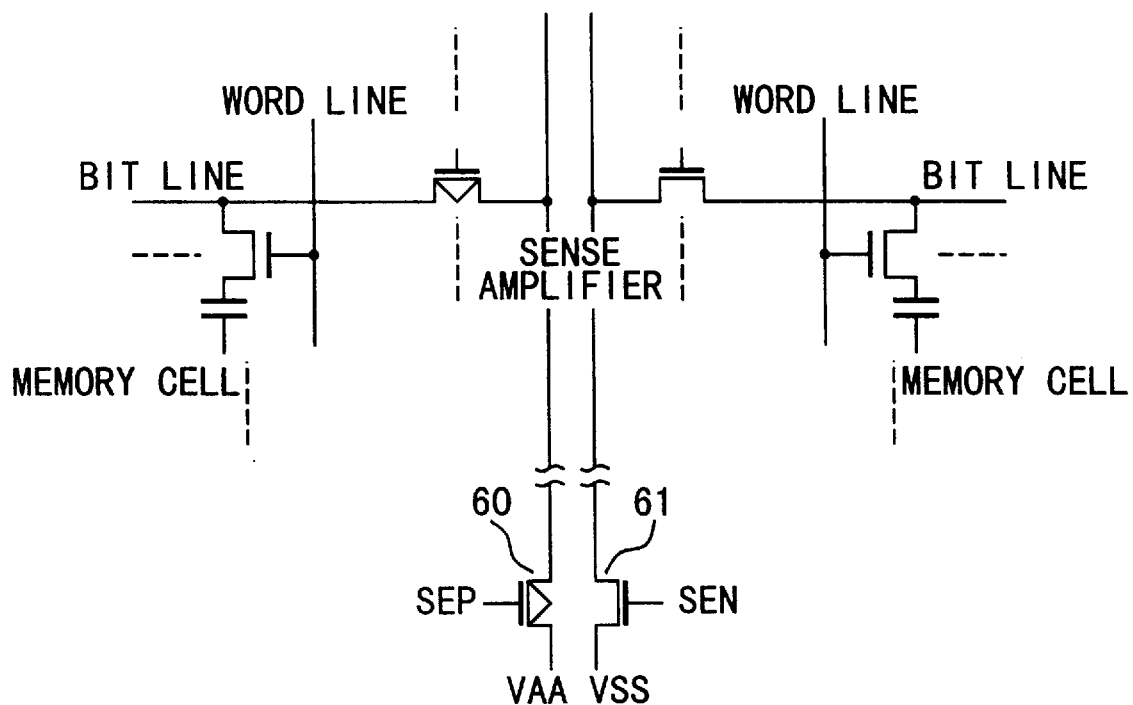
FIG. 9 is a view showing circuit examples of a memory cell and a sense amplifier.

FIG. 9 shows a circuit example of a sense amplifier and memory cells. FIG. 9 is an enlarged view of the area 18 shown in FIG. 7. The memory cells and sense amplifier shown in FIG. 9 are circuits generally used. Signals SEP and SEN are selected by an address signal A8 and are supplied to drive sense amplifiers. When transistors 60 and 61 corresponding to a core section to be activated are turned on, a voltage VAA is supplied to Pch sense amplifiers and a voltage VSS is supplied to Nch sense amplifiers.

Figure 10:
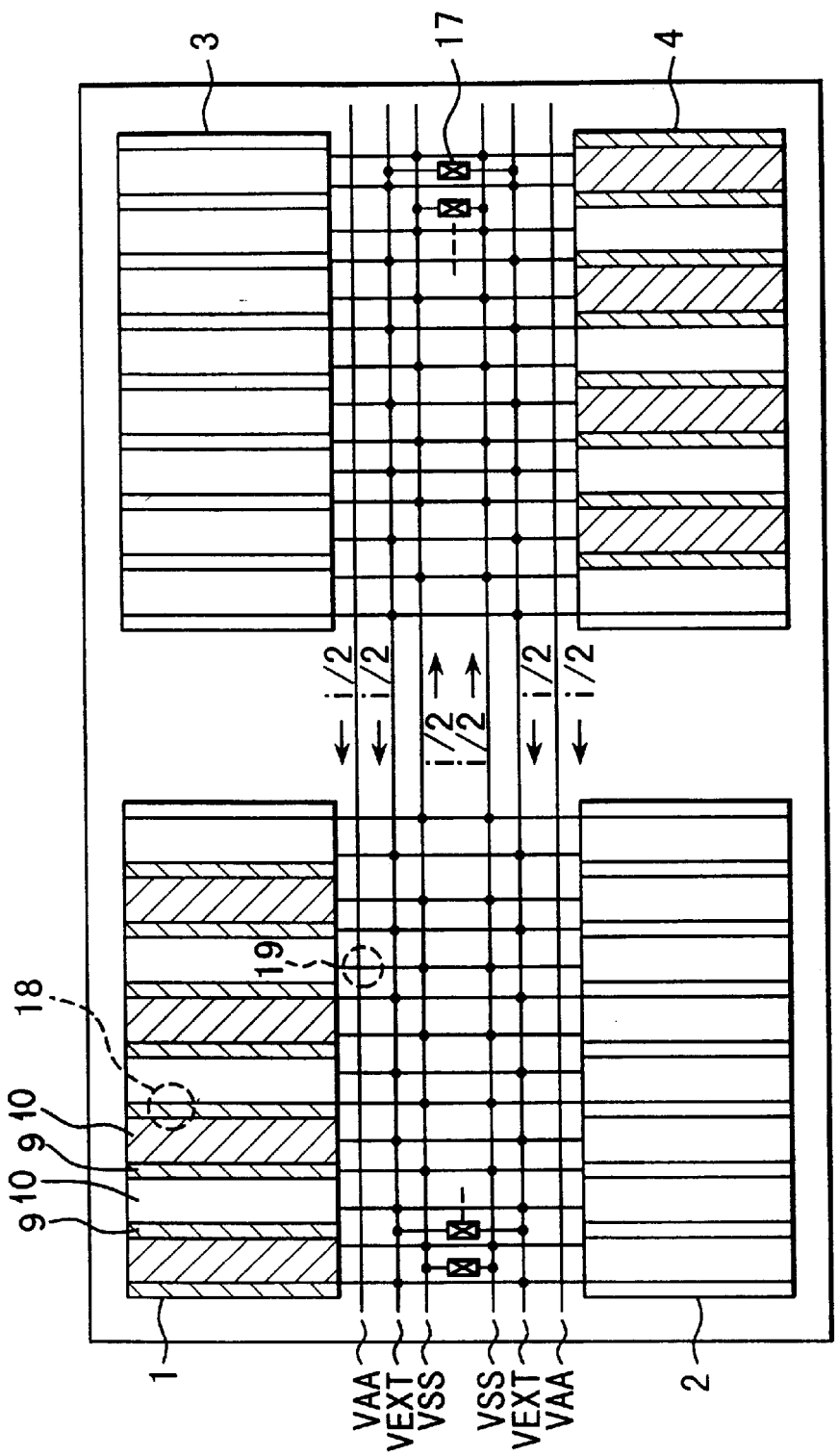
FIG. 10 is a view showing a layout of power supply lines according to the present invention.

FIG. 10 shows a layout of power supply lines according to the present invention.

The power supply lines VEXT, VAA, and VSS connected to the core section 1 are respectively connected to the power supply line VEXT, VAA, and VSS connected to the core section 3, at an area between the core sections 1 and 2. Likewise, the power supply lines VEXT, VAA, and VSS connected to the core section 3 are respectively connected to the power supply lines VEXT, VAA, and VSS connected to the core section 4, at an area between the core sections 3 and 4. The power supply lines VEXT, VAA, and VSS provided along the lower edge of the core section 1 are connected to the power supply lines VEXT, VAA, and VSS provided along the lower edge of the core section 3, and the power supply lines VEXT, VAA, and VSS provided along the upper edge of the core section 2 are connected to the power supply lines VEXT, VAA, and VSS provided along the upper edge of the core section 4.

Power supply pads supplied with power supply voltages Vcc and VSS are provided at an area between the core sections 3 and 4, and it is supplied that i expresses a current outputted from one of activated core sections. When the core sections 1 and 4 are activated, a current ½ flows through the power supply lines VEXT, VAA, and VSS connected to the core section 1 and also through the power supply lines VEXT, VAA, and VSS connected through the core section 2 which is not activated.

Thus, in the layout of power supply lines according to the present invention, a current flows though power supply lines provided for the core section, which is not activated, and therefore, power supply lines can be effectively used. As a result of this, the current flowing through each of the power supply lines is reduced to ½, and voltage drops of the power supply lines can therefore be reduced, so that influences from noise can be reduced. In addition, since power supply lines provided in the upper and lower sides of the pads are shared, the total line width of the power supply lines in both the upper and lower sides can be narrowed. Therefore, the chip size can be reduced and power supply lines can be provided between pads.

Figure 11:
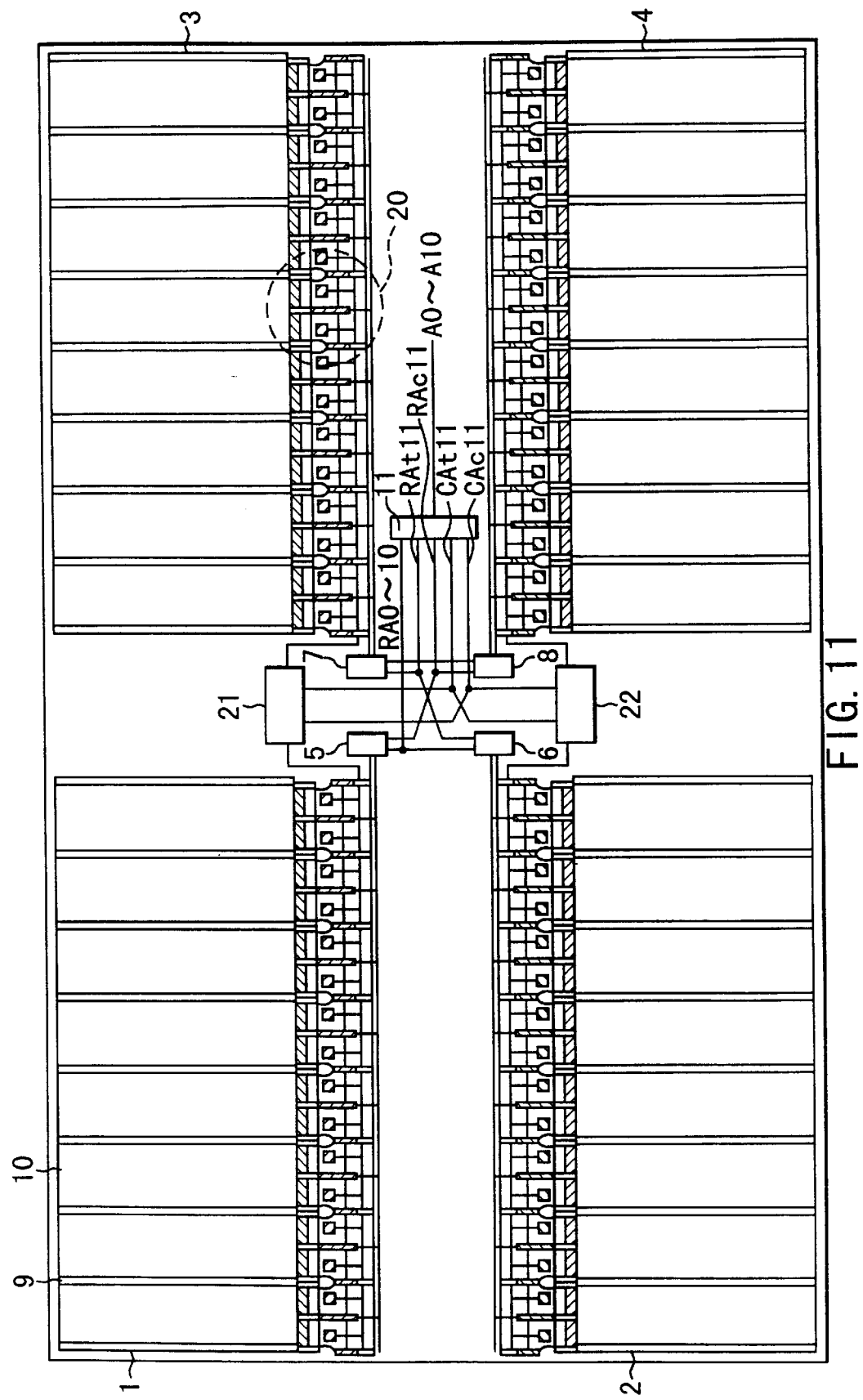
FIG. 11 is a view showing a specific pattern of a semiconductor memory device according to the present invention.

FIG. 11 is a view more specifically showing the semiconductor memory device shown in FIG. 4.

An address buffer 11 is supplied with address signals A0 to A11. The address buffer 11 outputs address signals RA0 to RA10 and control signals RAt11, RAc11, CAt11, and CAc11. The address signals RA0 to RA10 are the same as the address signals A0 to A10. The control signals RAt11 is the same as the address signal A11, and the control signal RAc11 is an inverted signal of the control signal RAt11. The control signal CAt11 is the same as the address signal A11, and the control signal CAc11 is an inverted signal of the control signal CAt11.

Core section buffers 5 to 8 are supplied with the address signals RA0 to RA10. The core section buffers 6 and 7 are supplied with the control signal RAt11, and the core section buffers 5 and 8 are supplied with the control signal RAc11.

Figure 12:
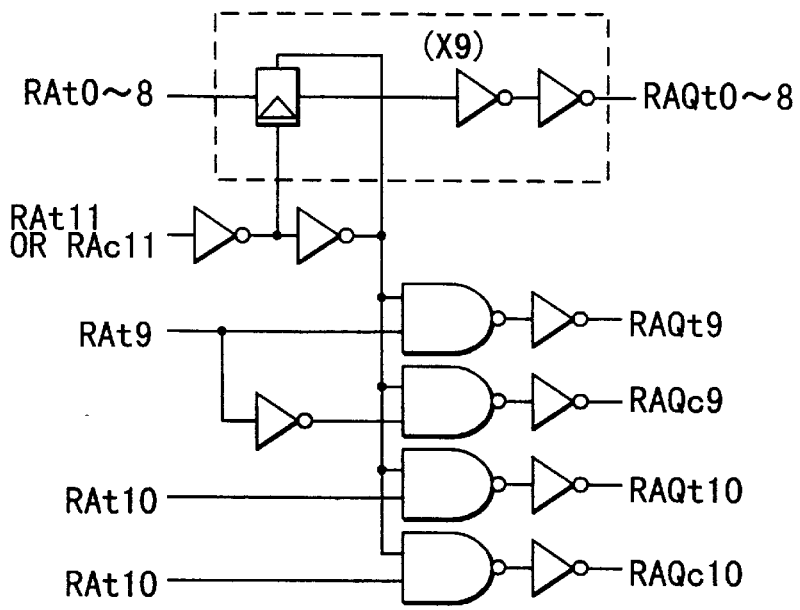
FIG. 12 is a view showing a circuit example of a core section buffer.

FIG. 12 shows a circuit example of the core section buffers 5 to 8. The core section buffers 5 to 8 generate lower address signals RAQt0 to RAQt7 and upper address signals RAQt8 to RAQt10, RAQc9, and RAQc10, from the address signals Rat10 and RAc10, the control signals RAC10, and the control signal RAt11 or RAc11. The core section buffers 5 to 8 respectively supply corresponding core sections 1 to 4 with the signals generated as above.

In the core section buffer circuit shown in FIG. 12, if the control signal RAt11 or RAc11 is of a low level, all the address signals RAQt0 to RAQt10 become to be of a low level. As a result, no address signals are supplied to a corresponding core section and the core section is inhibited from writing and reading data.

Figure 13:
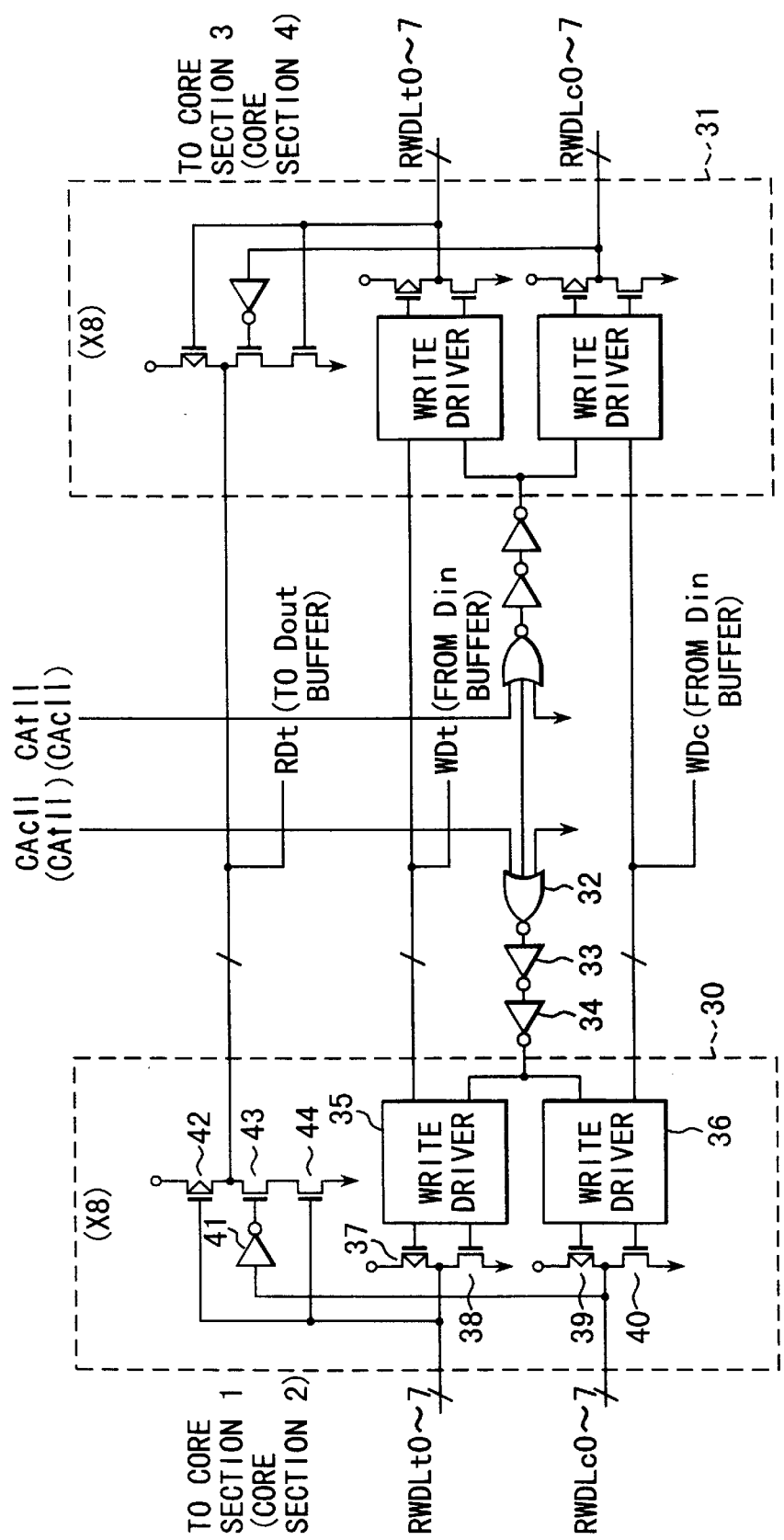
FIG. 13 is a view showing a data multiplexer.

FIG. 13 shows a circuit example of data multiplexers 21 and 22 shown in FIG. 11. The data multiplexers 21 and 22 have an equal structure. In FIG. 13, those reference symbols of signals or the like which are not written in parentheses belong to the data multiplexer 21, and those reference symbols which are written in parentheses belong to the data multiplexer 22.

Input terminals of the data multiplexers 21 and 22 are supplied with control signals CAt11 and CAc11 and also supplied with write data WDt and WDc from an input stage (not shown), i.e., a Din buffer. Each of data WDt and data WDc consists of inverted signals of the other data. Input/output terminals of the data multiplexer 21 are connected to RWD lines RWDL0 to RWDL7 of the core sections 1 and 3, and input/output terminals of the data multiplexer 22 are connected to RWD lines RWDL0 to RWDL7 of the core sections 2 and 4. Output terminals of the data multiplexers supply read data RDt to an output stage (not shown), i.e., a Dout buffer.

In the following, a circuit equivalent to a core section 1 in the data multiplexer 21 will be explained.

A control signal CAc11 is supplied to a first input terminal of a NOR gate 32. A second input terminal of the NOR gate 32 is grounded and an output terminal of the NOR gate 32 is connected to control terminals of write drivers 35 and 36 of through inverters 33 and 34 arranged in two stages. A data input terminal of the write driver 35 is supplied with a bit WDti of data outputted from a Din buffer, and a data input terminal of the write driver 36 is supplied with data WDci outputted from the Din buffer. In the following, i is an integer of one of 0 to 7.

A first output terminal of the write driver 35 is connected to the gate of a p-channel MOS transistor 37, and a second output terminal of the write driver 35 is connected to the gate of an n-channel MOS transistor 38. The source of the p-channel MOS transistor 37 is supplied with a power supply voltage Vcc. The drain of the p-channel MOS transistor 37 is connected to a RWD line RWDLti of the core section 1 and the drain of the n-channel MOS transistor 38. The source of the n-channel MOS transistor 38 is grounded.

A first output terminal of the write driver 36 is connected to the gate of a p-channel MOS transistor 39, and a second output terminal of the write driver 36 is connected to the gate of an n-channel MOS transistor 40. The source of the p-channel MOS transistor 39 is supplied with a power supply voltage Vcc. The drain of the p-channel MOS transistor 39 is connected to a RWD line RWDLci of the core section 1 and the drain of the n-channel MOS transistor 40. The source of the n-channel MOS transistor 40 is grounded.

The RWD line RWDLti is connected to the gate of a p-channel MOS transistor 42 and the gate of an n-channel MOS transistor 44. The RWD line RWDLci is connected to the gate of an n-channel MOS transistor 43 through an inverter 41.

The source of the p-channel MOS transistor 42 is supplied with a power supply voltage Vcc. The drain of the p-channel MOS transistor 42 is connected to an input line RDti of a Dout buffer and to the drain of the n-channel MOS transistor 43. The source of the n-channel MOS transistor 43 is connected to the drain of the n-channel MOS transistor 44, and the source of the n-channel MOS transistor 44 is grounded.

For each bit of data and RWD lines, there is provided a circuit 30 consisting of the write drivers 35 and 36, p-channel MOS transistors 37, 39, and 42, n-channel MOS transistors 38, 40, 43, and 44, and inverter 41. In the example shown in FIG. 13, eight circuits 30 are provided.

The data multiplexers 21 and 22 as described above supply RWD lines with data WD as write data from the Din buffer during write operation, and also supply the Dout buffer with data as read data from RWD lines.

Figure 14:
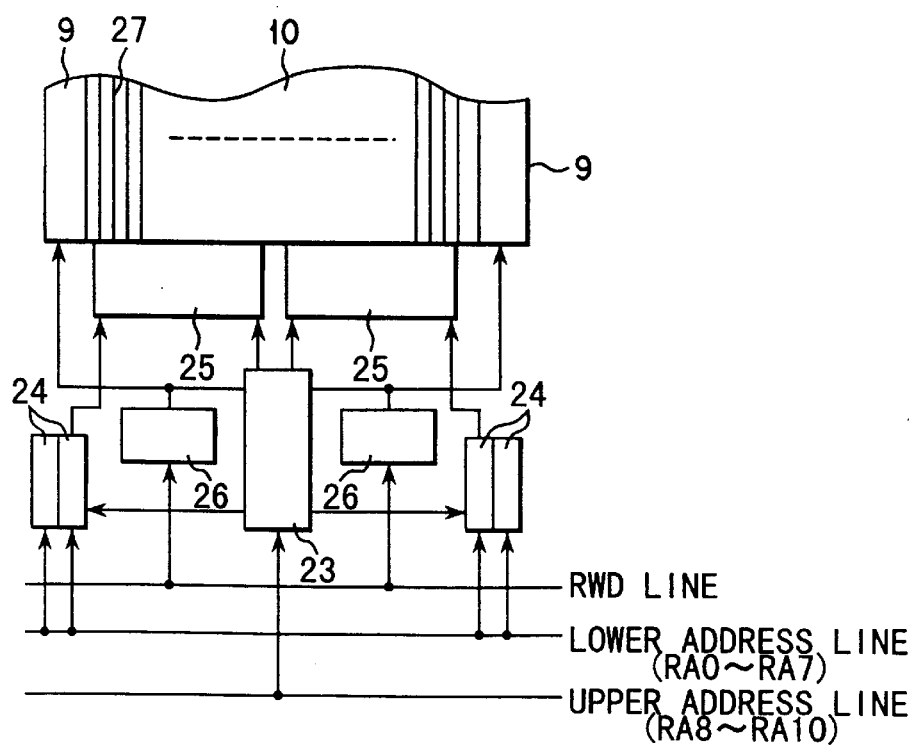
FIG. 14 is a view showing a peripheral circuit of a memory cell array.

FIG. 14 shows a peripheral circuit of memory cell arrays and sense amplifiers. This figure is an enlarged view of an area 20 in FIG. 11.

An array decoder 23 is provided for each of the memory cell arrays 10. An input terminal of the array decoder 23 is supplied with upper address signals RA8 to RA10. The array decoder 23 determines whether or not a corresponding memory cell 10 and a corresponding sense amplifier 9 are activated in accordance with the upper address signals.

When a memory cell array 10 is activated, a partial decoder 24 and a row decoder 25 corresponding to the memory cell array 10 are activated. The partial decoder 24 and the row decoder 25 select and activate a word line from a half of the memory cell array, and therefore, two partial decoders 24 and two row decoders 25 are provided for each cell array. The partial decoder 24 and the row decoder 25 decode lower address signals RA0 to RA7 and select a word line 27 in the memory cell array 10. In the circuit shown in FIG. 14, two row decoders 25 are provided for one memory cell array 10, and therefore, the row decoder 25 selects one word line from the half of the memory cell array 10. DQ buffers 26 are provided between the RWD line and the sense amplifier 9.

The present invention is not limited to the embodiment described above but may be modified as follows, for example.

Figure 15:
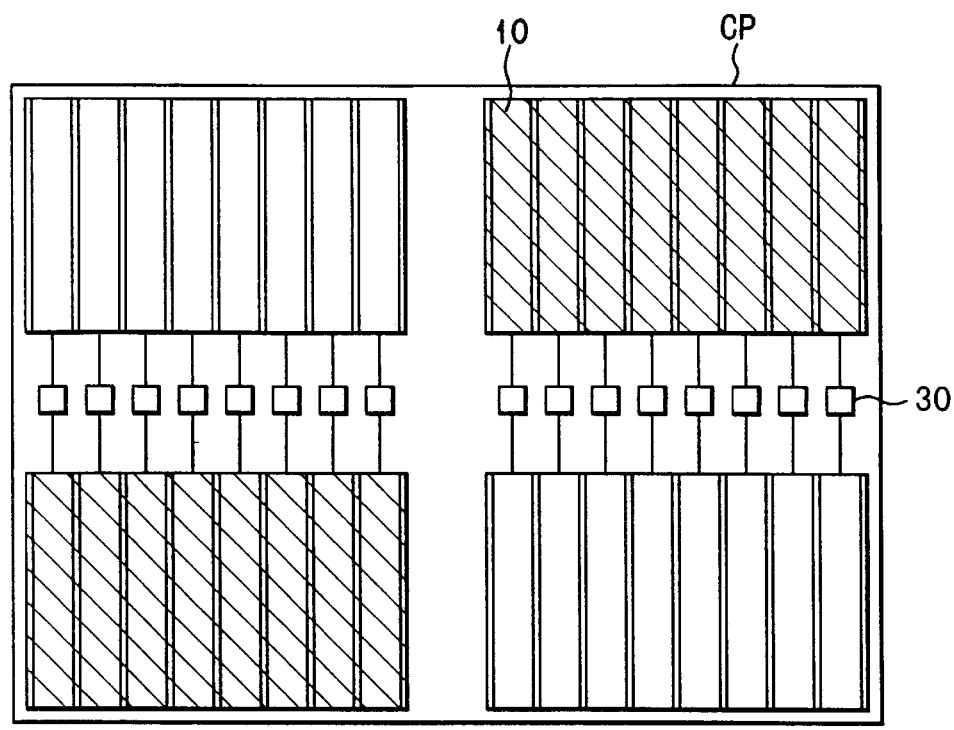
FIG. 15 is a view showing an embodiment in which output buffers are shared by core sections 1 and 2 as well as core sections 3 and 4.

FIG. 15 shows an embodiment where output buffers 30 are shared by core sections 1 and 2 and by core sections 3 and 4.

In the present invention, for example, as is indicated by simultaneously activated core sections hatched by oblique lines, the core sections 1 and 2 or the core sections 3 and 4 are not simultaneously activated. Therefore, outputs from activated core sections can be selectively extracted from output buffers 30 even if output buffers are shared by core sections 1 and 2 and also in common by core sections 3 and 4, as in the present embodiment. In this manner, the chip structure can further be reduced.

Figure 16:
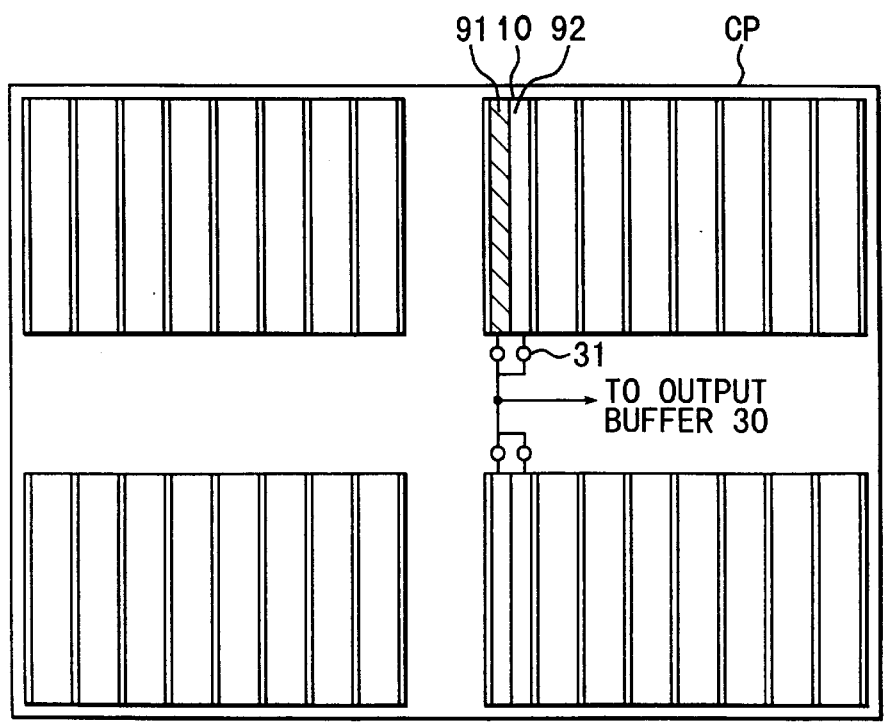
FIG. 16 is a view showing a case where shared output buffers 30 are applied to memory cell arrays constructed in a structure in which each memory cell array is activated in units of halves of a memory cell.

FIG. 16 shows a case in which sharing of the output buffers 30 shown in FIG. 15 is applied to memory cell arrays constructed in a structure in which halves (which are referred to as a first sub-memory array 91 and a second sub-memory array 92) of each memory cell array 9 are separately activated. FIG. 16 shows only output lines from one memory cell array. In FIG. 16, the first sub-memory array 91 and the second sub-memory array 92 are connected to each other such that data from the array 91 and data from the array 92 are respectively amplified by sense amplifiers (not shown) and thereafter pass through switching elements 31. Like the case of FIG. 15, output buffers are shared by the core sections 1 and 2 and also shared by the core sections 3 and 4.

In the present embodiment, the structure as described above is realized and contributes to a reduction of the chip area, on the grounds that core sections provided on a diagonal line are simultaneously activated and since first and second sub-memory arrays are not simultaneously activated.

FIG. 16 shows an embodiment in which each memory cell array is divided and subjected to switching by a switching element so that output buffers are shared. However, sense amplifiers may be shared by adjacent memory cell arrays. In this case, adjacent memory cell arrays sharing a sense amplifier are selectively connected to the sense amplifier by making connection/disconnection therebetween by a switching element. Also, like in FIG. 15, the core sections 1 and 2 share output buffers and the core sections 3 and 4 share output buffers. In the present embodiment, the number of sense amplifiers can be reduced in comparison with the structure shown in FIG. 15, so that the chip area can further reduced.

Figure 17:
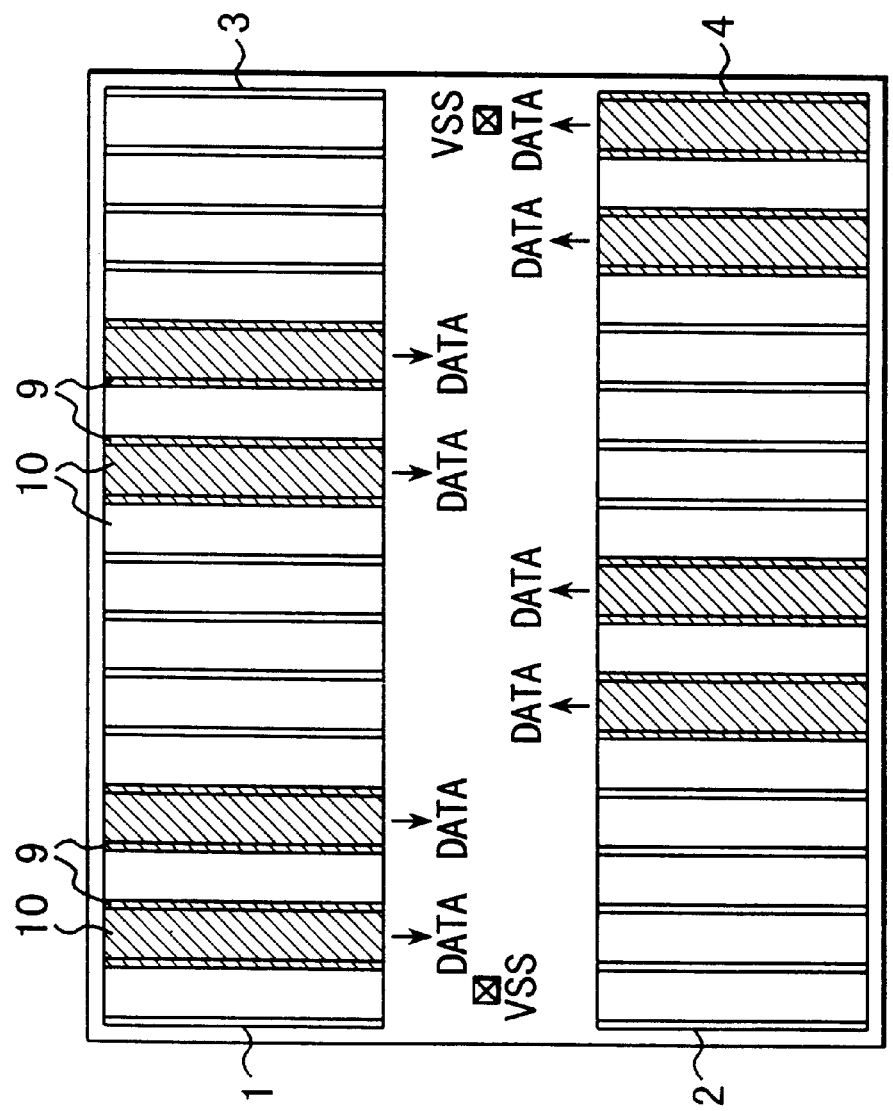
FIG. 17 is a view showing an embodiment in which each memory cell array is divided into a plurality of sub-memory arrays in a row direction.

FIG. 17 shows an embodiment in which memory cell arrays in each core section are selectively activated. In FIG. 17, the memory cell arrays can be activated independently. In this case, the core sections 1 to 4 can be simultaneously activated, and a part of the core section 1 and a part of core section 2 arranged on diagonal line, a part of the core section 3 and a part of core section 4 arranged on diagonal line, are simultaneously activated.

By combining the structure in which buffers or sense amplifiers are shared as described above with the present invention, it is advantageously possible to realize a semiconductor memory device which is capable of performing multi-bit simultaneous output with reduced noise, without increasing the chip area.

The present invention is not limited to the embodiments described above.

Figure 18:
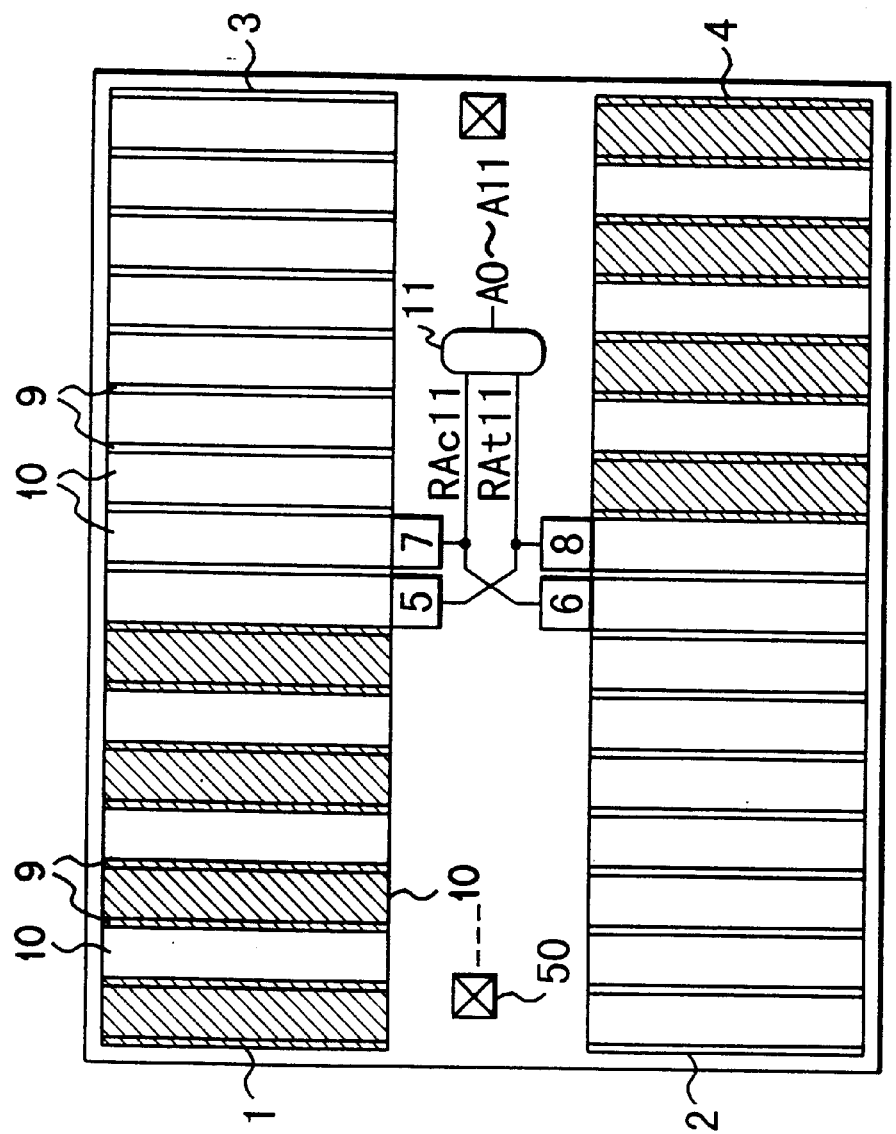
FIG. 18 is an example in which sense amplifiers and row decoders are shared and core sections are arranged longitudinally.

Although the core sections are arranged apart from each other in the embodiments described above, the core sections may be positioned continuously. For example, FIG. 18 shows an example in which sense amplifiers are shared and core sections are arranged longitudinally.

The above description has been made of an example using four core sections. However, this example merely cites a structure of a minimum unit, and therefore, more core sections than four may be included in the structure.

In this case, the present invention needs only to be arranged so as to simultaneously activate core sections provided on a diagonal line. All the memory cell arrays in a core section need not be simultaneously activated, but at least one memory cell array (or one sub-memory cell array where sub-memory cell arrays are included) needs to be activated.

Figure 19:
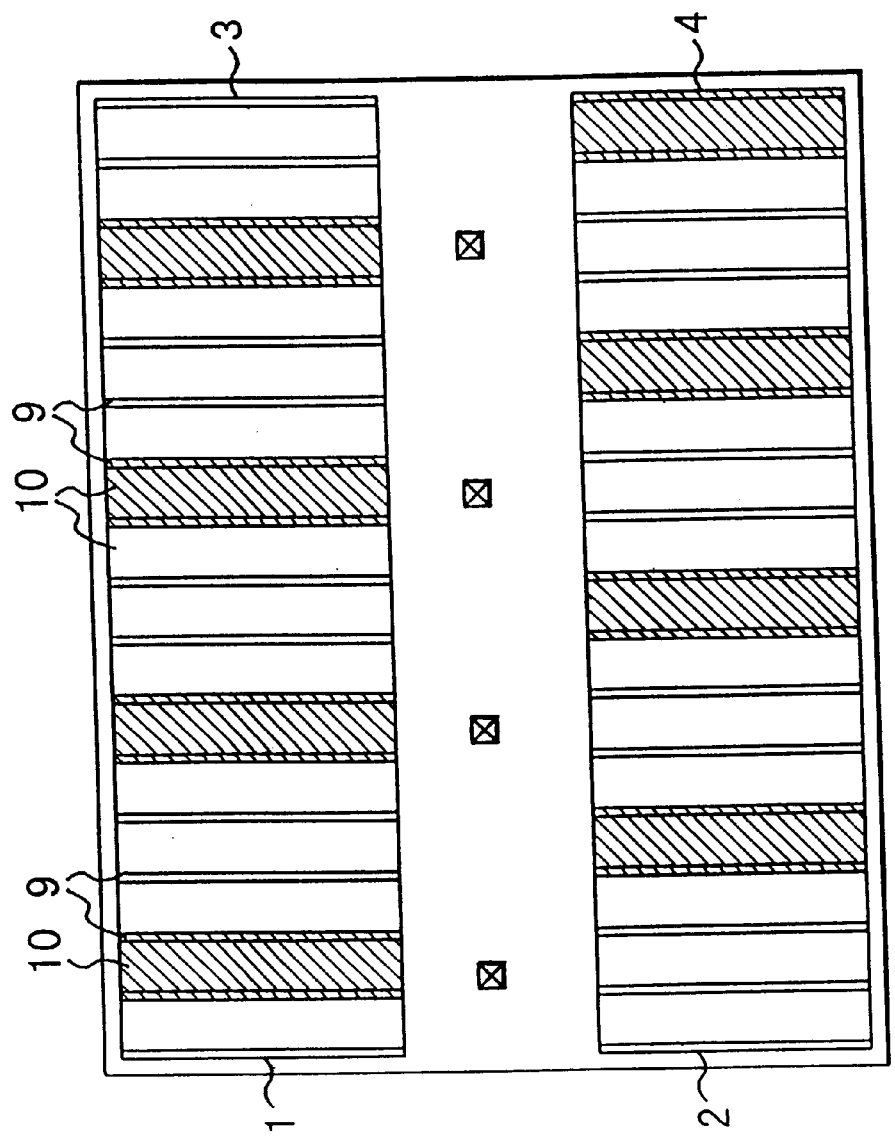
FIG. 19 show a device having 4 power supply pads.
Figure 20:
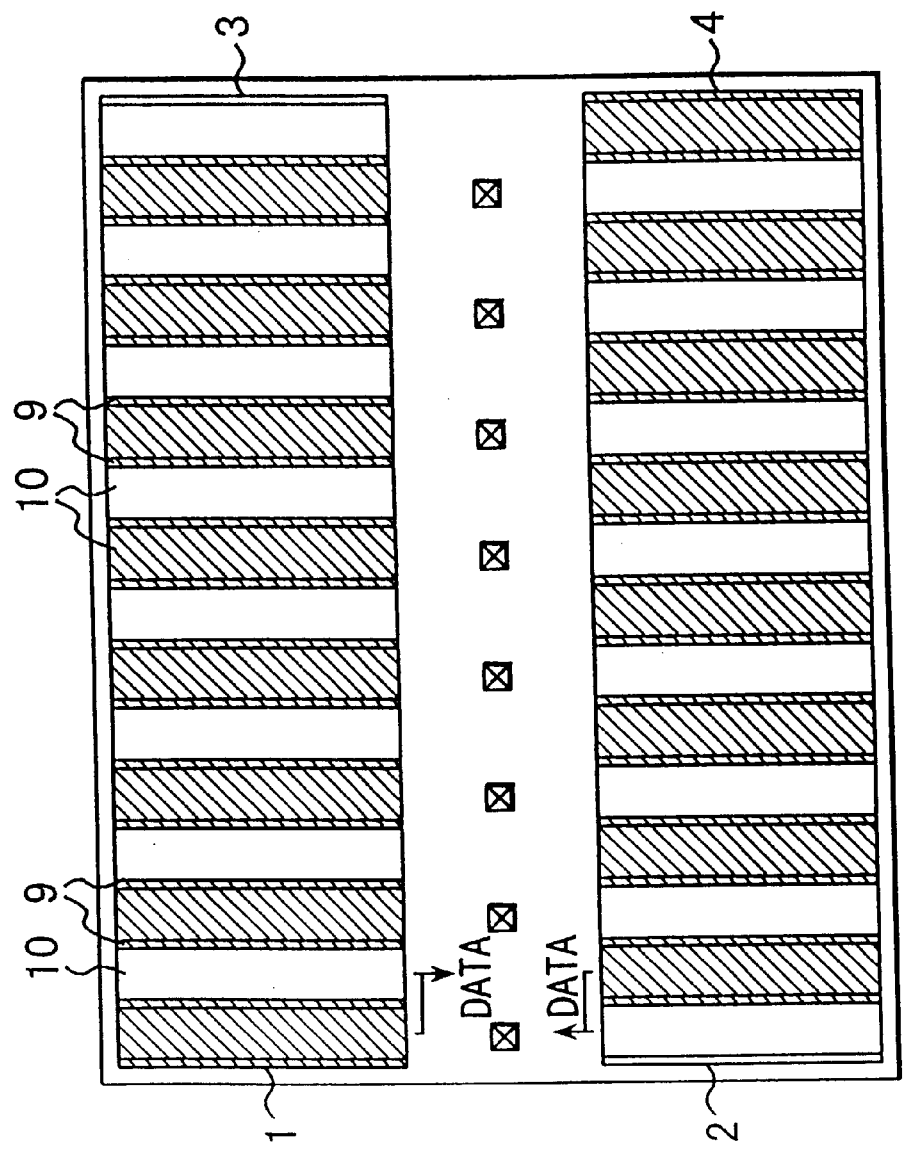
FIG. 20 shows a device having 8 power supply pads.

In the above embodiment, a case where a device has two power supply pads is explained, but the present invention can be applied to a device having 3 or more power supply pads. FIGS. 19 and 20 show devices having 4 and 8 power supply pads, respectively.

In FIG. 19, for example, each core section has eight memory cell arrays, and parts of the memory cell arrays on diagonal line in core sections 1 and 2 are simultaneously activated. Specifically, each of the core sections are divided into two sections (hereinafter referred to as a sub-core section), and the power supply pads are arranged for corresponding sub-core sections. For example, first power supply pad shared by one of the sub-core sections of the core section 1 and one of the sub-core sections of the core section 2. With this configuration, for example, memory cell arrays in one of the sub-core sections in the core section 1 and memory cell arrays in one of sub-core sections in the core section 2, which share a power supply pad and are arranged diagonally, are simultaneously activated. An operation of the core sections 3 and 4 arranged on the left side is the same as above and therefore explanation will be omitted.

FIG. 20 shows an example of increasing the number of power supply pads. Four memory cell array share one power supply pad, and memory cell arrays which are arranged diagonally are simultaneously activated.

Figure 21:
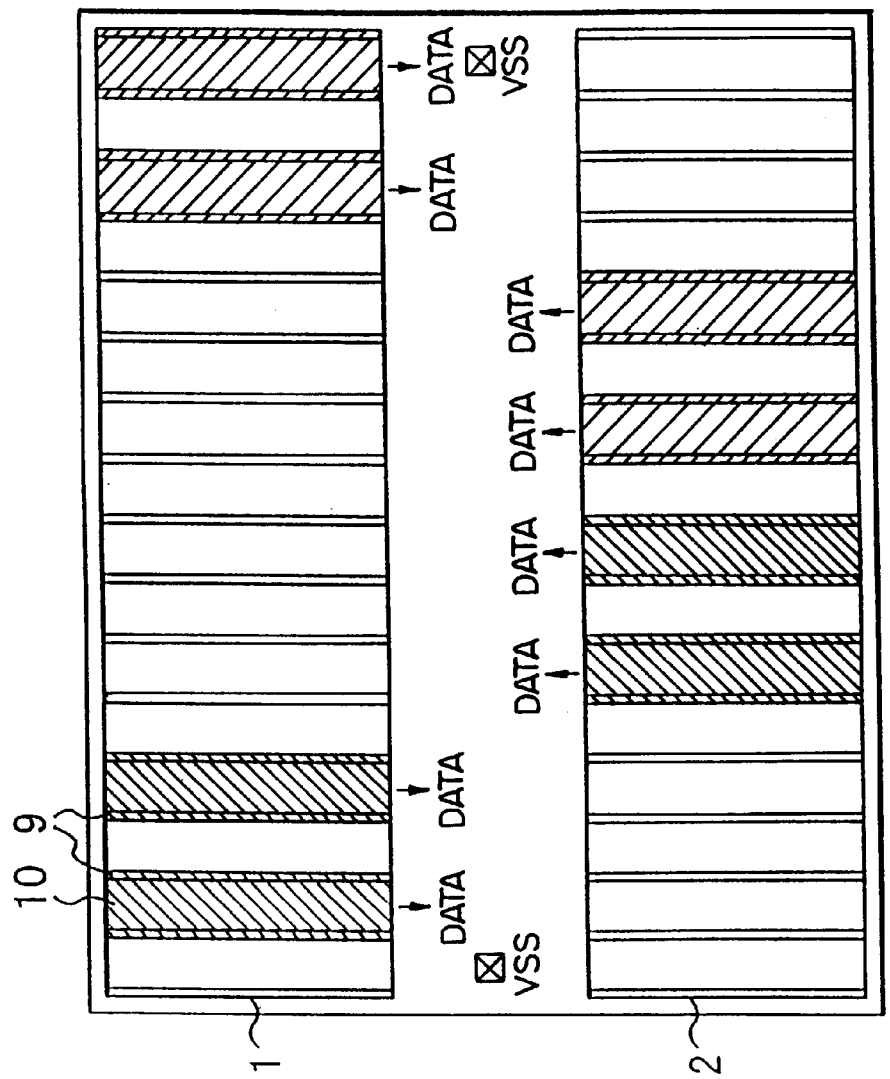
FIG. 21 shows another example of activation of memory cell arrays.

FIG. 21 shows an example of memory cell arrays to be simultaneously activated which are arranged in a mirror by the center of the chip.

As described above, the present invention can employ any layout or activation method of memory cell arrays, when simultaneously activated memory cell arrays are not concentrated.

Further, the present invention can be more variously modified within the scope of the subject matter of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a first core section including a plurality of memory cell arrays and a plurality of sense amplifiers, said first core section having a rectangular shape with a long side and a short side;
   a second core section including a plurality of memory cell arrays and a plurality of sense amplifiers, said second core section having a rectangular shape with a long side and a short side, the long side of said second core section facing the long side of said first core section;
   a third core section including a plurality of memory cell arrays and a plurality of sense amplifiers, said third core section having a rectangular shape with a long side and a short side, the short side of said third core section facing the short side of said first core section;
   a fourth core section including a plurality of memory cell arrays and a plurality of sense amplifiers, said fourth core section having a rectangular shape with a long side and a short side, the long side of said fourth core section facing the long side of said third core section;
   an input circuit for inputting first and second activation signals;
   a first control signal line coupled between said first core section and said fourth core section to activate said first core section and said fourth core section in accordance with said first activation signal; and
   a second control signal line coupled between said second core section and said third core section to activate said second core section and said third core section in accordance with said second activation signal.

2. A semiconductor memory device comprising:
   a first core section including a plurality of memory cell arrays and a plurality of sense amplifiers, said first core section having a rectangular shape with a long side and a short side;
   a second core section including a plurality of memory cell arrays and a plurality of sense amplifiers, said second core section having a rectangular shape with a long side and a short side, the long side of said second core section facing the long side of said first core section;
   a third core section including a plurality of memory cell arrays and a plurality of sense amplifiers, said third core section having a rectangular shape with a long side and a short side, the short side of said third core section facing the short side of said first core section;
   a fourth core section including a plurality of memory cell arrays and a plurality of sense amplifiers, said fourth core section having a rectangular shape with a long side and short side, the long side of said fourth core section facing the long side of said third core section;
   an input terminal supplied with an address signal to output a first or second activation signal in accordance with a part of the address signal;
   a first control signal line coupled to said input terminal, said first core section and said fourth core section to activate one array of said first core section and one array of said fourth core section in accordance with a part of the address signal; and
   a second control signal line coupled to said input terminal, said second core section and said third core section to activate one array of said second core section and one array of said third core section in accordance with the part of the address signal.

3. A semiconductor memory device comprising:
a first core section including a plurality of memory cell arrays and a plurality of sense amplifiers, said first core section having a rectangular shape with a long side and a short side;
a second core section including a plurality of memory cell arrays and a plurality of sense amplifiers, said second core section having a rectangular shape with a long side and a short side, the long side of said second core section facing the long side of said first core section;
a third core section including a plurality of memory cell arrays and a plurality of sense amplifiers, said third core section having a rectangular shape with a long side and a short side, the short side of said third core section facing the short side of said first core section;
a fourth core section including a plurality of memory cell arrays and a plurality of sense amplifiers, said fourth core section having a rectangular shape with a long side and a short side, the long side of said fourth core section facing the long side of said third core section;
an input terminal supplied with an address signal to output a first or second activation signal in accordance with a part of the address signal;
a first control signal line coupled to said input terminal, said first core section and said fourth core section to activate said plurality of memory cell arrays of said first core section and said plurality of memory cell arrays of said fourth core section in accordance with the part of the address signal; and
a second control signal line coupled to said input terminal, said second core section and said third core section to activate said plurality of memory cell arrays of said second core section and said plurality of memory cell arrays of said third core section in accordance with the part of the address signal.

4. A semiconductor memory device comprising:
a first core section including a plurality of memory cell arrays and a plurality of sense amplifiers, said first core section having a rectangular shape with a long side and a short side;
a second core section including a plurality of memory cell arrays and a plurality of sense amplifiers, said second core section having a rectangular shape with a long side and a short side, the long side of said second core section facing the long side of said first core section;
a third core section including a plurality of memory cell arrays and a plurality of sense amplifiers, said third core section having a rectangular shape with a long side and a short side, the short side of said third core section facing the short side of said first core section;
a fourth core section including a plurality of memory cell arrays and a plurality of sense amplifiers, said fourth core section having a rectangular shape with a long side and a short side, the long side of said fourth core section facing the long side of said third core section;
an address buffer having an input terminal supplied with an address signal to output a first or second activation signal in accordance with a part of the address signal;
a first control signal line coupled to said address buffer, said first core section and said fourth core section to activate said first core section and said fourth core section in accordance with the first activation signal; and
a second control signal line coupled to said address buffer, said second core section and said third core section to activate said second core section and said third core section in accordance with the second activation signal.

5. A semiconductor memory device comprising:
a first core section including a plurality of memory cell arrays and a plurality of sense amplifiers, said first core section having a rectangular shape with a long side and a short side;
a first core section buffer connected to said first core section;
a second core section including a plurality of memory cell arrays and a plurality of sense amplifiers, said second core section having a rectangular shape with a long side and a short side, the long side of said second core section facing the long side of said first core section;
a second core section buffer connected to said second core section;
a third core section including a plurality of memory cell arrays and a plurality of sense amplifiers, said third core section having a rectangular shape with a long side and a short side, the short side of said third core section facing the short side of said first core section;
a third core section buffer connected to said third core section;
a fourth core section including a plurality of memory cell arrays and a plurality of sense amplifiers, said fourth core section having a rectangular shape with a long side and a short side, the long side of said fourth core section facing the long side of said third core section;
a fourth core section buffer connected to said fourth core section;
an address buffer having an input terminal supplied with an address signal to output a first or second activation signal in accordance with a part of the address signal;
a first control signal line coupled to said address buffer, said first core section buffer and said fourth core section buffer to activate said first core section and said fourth core section in accordance with the first activation signal; and
a second control signal line coupled to said address buffer, said second core section buffer and said third core section buffer to activate said second core section and said third core section in accordance with the second activation signal.

6. A semiconductor memory device comprising:
a first core section including a plurality of memory cell arrays respectively provided in a plurality of lines and respectively having a rectangular shape with a long side and a short side, and a plurality of sense amplifiers provided in a plurality of lines respectively having a rectangular shape with a long side and a short side;
a second core section including a plurality of memory cell arrays respectively provided in a plurality of lines and respectively having a rectangular shape with a long side and a short side, and a plurality of sense amplifiers provided in a plurality of lines respectively having a rectangular shape with a long side and a short side, and provided adjacent to said first core section, wherein the short side of each memory cell array in said second core section facing to the short side of each memory cell array in said first core section, and the short side of each sense amplifier in said second core section facing to the short side of each sense amplifier in said first core section;
a third core section including a plurality of memory cell arrays respectively provided in a plurality of lines and respectively having a rectangular shape with a long side and a short side, and a plurality of sense amplifiers provided in a plurality of lines respectively having a rectangular shape with a long side and a short side; provided adjacent to said first core section, wherein the longitudinal direction of each memory cell array in said third core section parallels the longitudinal direction of each memory cell array in said first core section, and the longitudinal direction of the sense amplifier in said third core section parallels the longitudinal direction of each sense amplifier in said first core section;

a fourth core section including a plurality of memory cell arrays respectively provided in a plurality of lines and respectively having a rectangular shape with a long side and short side, and a plurality of sense amplifiers provided in a plurality of lines respectively having a rectangular shape with a long side and a short side; provided adjacent to said first core section, wherein the short side of each memory cell array in said fourth core section facing to the short side of each memory cell array in said third core section, and the short side of each sense amplifier in said fourth core section facing the short side of each sense amplifier in said third core section;

an input terminal supplied with an address signal to output a first or second activation signal in accordance with a part of the address signal;

a first control signal line coupled to said input terminal, said first core section and said fourth core section to activate one array of said first core section and one array of said fourth core section in accordance with the part of the address signal; and a second control signal line coupled to said input terminal, said second core section and said third core section to activate one array of said second core section and one array of said third core section in accordance with the part of the address signal.

7. A semiconductor memory device comprising:

a first core section including a plurality of memory cell arrays respectively provided in a plurality of lines and respectively having a rectangular shape with a long side and a short side, and a plurality of sense amplifiers provided in a plurality of lines respectively having a rectangular shape with a long side and a short side;

a second core section including a plurality of memory cell arrays respectively provided in a plurality of lines and respectively having a rectangular shape with a long side and a short side, and a plurality of sense amplifiers provided in a plurality of lines respectively having a rectangular shape with a long side and a short side, and provided adjacent to said first core section, wherein the short side of each memory cell array in said second core section facing to the short side of each memory cell array in said first core section, and the short side of each sense amplifier in said second core section facing the short side of each sense amplifier in said first core section;

a third core section including a plurality of memory cell arrays respectively provided in a plurality of lines and respectively having a rectangular shape with a long side and a short side, and a plurality of sense amplifiers provided in a plurality of lines respectively having a rectangular shape with a long side and short side, and provided adjacent to said first core section, wherein the longitudinal direction of each memory cell array in said third core section parallels the longitudinal direction of each memory cell array in said first core section, and the longitudinal direction of each sense amplifier in said third core section parallels the longitudinal direction of each sense amplifier in said first core section;

a fourth core section including a plurality of memory cell arrays respectively provided in a plurality of lines and respectively having a rectangular shape with a long side and a short side, and a plurality of sense amplifiers provided in a plurality of lines respectively having a rectangular shape with a long side and a short side, and provided adjacent to said first core section, wherein the short side of each memory cell array in said fourth core section facing to the short side of each memory cell array in said third core section, and the short side of each sense amplifier in said fourth core section facing to the short side of each sense amplifier in said third core section;

a first input terminal supplied with a supply voltage provided between said first core section and said second core section;

a second input terminal supplied with the supply voltage provided between said third core section and said fourth core section; and wherein an amount of electric current which flows when said first core section and said fourth core section are activated is substantially equal to an amount of electric current which flows when said second core section and said third core section are activated.

8. A semiconductor memory device according to claim 7, further comprising:

a first output buffer coupled between said first core section and said second core section, and a second output buffer coupled between said third core section and said fourth core section.

9. A semiconductor memory device comprising:

a first core section including a plurality of sub-memory cell arrays respectively provided in a plurality of lines and respectively having a rectangular shape with a long side and short side, and a plurality of sense amplifiers provided in a plurality of lines respectively having a rectangular shape with a long side and a short side;

a second core section including a plurality of sub-memory cell arrays respectively provided in a plurality of lines and respectively having a rectangular shape with a long side and a short side, and a plurality of sense amplifiers provided in a plurality of lines respectively having a rectangular shape with a long side and a short side, and provided adjacent to said first core section, wherein the short side of each sub-memory cell array in said second core section facing to the short side of each memory cell array in said first core section, and the short side of each sense amplifier in said second core section facing the short side of each sense amplifier in said first core section;

a third core section including a plurality of sub-memory cell arrays respectively provided in a plurality of lines and respectively having a rectangular shape with a long side and a short side, and a plurality of sense amplifiers provided in a plurality of lines respectively having a rectangular shape with a long side and a short side, and provided adjacent to said first core section, wherein the longitudinal direction of each sub-memory cell array in said third core section parallels the longitudinal direction of each sub-memory cell array in said first core section, and the longitudinal direction of each sense amplifier in said third core section parallels the longitudinal direction of each sense amplifier in said first core section;

a fourth core section including a plurality of sub-memory cell arrays respectively provided in a plurality of lines and respectively having a rectangular shape with a long side and a short side, and a plurality of sense amplifiers provided in a plurality of lines respectively having a rectangular shape with a long side and a short side, and provided adjacent to said first core section, wherein the short side of each sub-memory cell array in said fourth core section facing the short side of each sub-memory cell array in said third core section, and the short side of each sense amplifier in said fourth core section facing the short side of each sense amplifier in said third core section;

a first input terminal supplied with a supply voltage provided between said first core section and said second core section;

a second input terminal supplied with the supply voltage provided between said third core section and said fourth core section; and wherein the amount of electric current which flows when said first core section and said fourth core section are activated is substantially equal to the amount of the electric current which flows when said second core section and said third core section are activated.

10. A semiconductor memory device comprising:

a first core section including a plurality of sub-memory cell arrays respectively provided in a plurality of lines and respectively having a rectangular shape with a long side and a short side, and a plurality of sense amplifiers provided in a plurality of lines respectively having a rectangular shape with a long side and a short side;

a second core section including a plurality of sub-memory cell arrays respectively provided in a plurality of lines and respectively having a rectangular shape with a long side and a short side, and a plurality of sense amplifiers provided in a plurality of lines respectively having a rectangular shape with a long side and a short side, and provided adjacent to said first core section, wherein the short side of each sub-memory cell array in said second core section facing the short side of each memory cell array in said first core section, and the short side of each sense amplifier in said second core section facing the short side of each sense amplifier in said first core section;

a third core section including a plurality of sub-memory cell arrays respectively provided in a plurality of lines and respectively having a rectangular shape with a long side and a short side, and a plurality of sense amplifiers provided in a plurality of lines respectively having a rectangular shape with a long side and a short side, and provided adjacent to said first core section, wherein the longitudinal direction of each sub-memory cell array in said third core section parallels the longitudinal direction of each sub-memory cell array in said first core section, and the longitudinal direction of each sense amplifier in said third core section parallels the longitudinal direction of each sense amplifier in said first core section; and a fourth core section including a plurality of sub-memory cell arrays respectively provided in a plurality of lines and respectively having a rectangular shape with a long side and a short side, and a plurality of sense amplifiers provided in a plurality of lines respectively having a rectangular shape with a long side and a short side, and provided adjacent to said first core section, wherein the short side of each sub-memory cell array in said fourth core section facing the short side of each sub-memory cell array in said third core section, and the short side of each sense amplifier in said fourth core section facing the short side of each sense amplifier in said third core section, wherein any sub-memory cell array of said first core section and any sub-memory cell array of said second core section are not simultaneously activated, and any sub-memory cell array of said third core section and any sub-memory cell array of said fourth core section are not simultaneously activated.

11. A semiconductor memory device according to claim 9, wherein while said first core section and said fourth core section are activated, one sub-memory cell array of said first core section and the one sub-memory cell array of said fourth core section are simultaneously activated, and while said second core section and said third core section are activated, one sub-memory cell array of said second core section and the one sub-memory cell array of said third e section are simultaneously activated.

* * * * *

UNITED STATES PATENT AND TRADEMARK OFFICE
CERTIFICATE OF CORRECTION

PATENT NO.    : 6,272,063 B1
DATED         : August 7, 2001
INVENTOR(S)   : Kenichi Matoba et al.

It is certified that error appears in the above-identified patent and that said Letters Patent is hereby corrected as shown below:

Column 18, claim 11,
Line 42, "e" has been replaced with -- core --.

Signed and Sealed this

Second Day of April, 2002

*Attest:*

JAMES E. ROGAN
*Director of the United States Patent and Trademark Office*

*Attesting Officer*